（12） United States Patent
Hiraide

(10) Patent No.: US 8,706,439 B2
(45) Date of Patent: Apr. 22, 2014

(54) TEST APPARATUS AND TEST METHOD

(75) Inventor: Mamoru Hiraide, Saitama (JP)

(73) Assignee: Advantest Corporation, Tokyo (JP)

( * ) Notice: Subject to any disclaimer, the term of this patent is extended or adjusted under 35 U.S.C. 154(b) by 1150 days.

(21) Appl. No.: 12/647,504

(22) Filed: Dec. 27, 2009

(65) Prior Publication Data

US 2011/0161041 A1     Jun. 30, 2011

(51) Int. Cl.
*G06F 11/30* (2006.01)
*G01D 21/00* (2006.01)
*G06F 17/40* (2006.01)
*G06F 19/00* (2011.01)

(52) U.S. Cl.
USPC ............... 702/122; 73/865.8; 324/750.01; 340/653; 370/229; 375/224; 702/1; 702/108; 702/127; 702/182; 702/187; 702/188

(58) Field of Classification Search
USPC .......... 73/432.1, 865.8, 865.9, 866.3; 324/72, 324/73.1, 500, 537, 750.01, 762.01, 762.02, 324/762.03, 762.04, 762.05, 762.06, 324/763.01; 340/500, 540, 635, 653, 679, 340/870.01, 870.07, 870.16; 370/229, 235, 370/236, 237, 241; 702/1, 33, 34, 105, 117, 702/119, 122, 123, 124, 127, 182, 187, 188, 702/189; 708/100, 105, 200; 709/223, 224
IPC ............... G01D 7/00,9/00, 21/00; G01R 29/00, G01R 31/00, 31/28, 31/282, 31/2832, 31/2834, G01R 31/317; G06F 11/00, 11/30, 11/3003, G06F 11/3034, 11/3037, 11/3041, 11/3058, G06F 11/32, 11/34, 11/3409, 17/00, 17/40, G06F 19/00, 2011/00; G11C 29/00, 99/00, G11C 2029/00
See application file for complete search history.

(56) References Cited

U.S. PATENT DOCUMENTS

| | | | | |
|---|---|---|---|---|
| 3,082,374 A | * | 3/1963 | Buuck | 324/73.1 |
| 4,493,079 A | * | 1/1985 | Hughes, Jr. | 714/738 |
| 4,658,400 A | * | 4/1987 | Brown et al. | 714/736 |
| 4,794,599 A | * | 12/1988 | Purcell et al. | 714/719 |
| 5,673,272 A | * | 9/1997 | Proskauer et al. | 714/724 |
| 5,796,753 A | | 8/1998 | Kato | |
| 7,340,364 B1 | | 3/2008 | Kumaki | |
| 7,502,708 B2 | | 3/2009 | Kumaki | |

(Continued)

FOREIGN PATENT DOCUMENTS

| | | |
|---|---|---|
| JP | H08-184648 A | 7/1996 |
| JP | 2000-183886 A | 6/2000 |

(Continued)

OTHER PUBLICATIONS

Andrew C. Evans, "The New ATE: Protocol Aware", Test Conference, 2007. ITC 2007. IEEE International, Oct. 21-26, 2007, pp. 1-10, Santa Clara, CA, US.

(Continued)

*Primary Examiner* — Edward Cosimano

(57) ABSTRACT

Provided is a test apparatus that tests a device under test, comprising: a test module that tests the device under test by sending signals to and receiving signals from the device under test; a test controller that controls the test module; and a network that transmits communication packets between the test module and the test controller, wherein at least one of the test module and the network transmits to the test controller a usage state packet that indicates a usage state of a communication buffer that buffers the communication packets.

9 Claims, 5 Drawing Sheets

(56) References Cited

U.S. PATENT DOCUMENTS

| | | | |
|---|---|---|---|
| 7,603,604 B2 * | 10/2009 | Yamada et al. | 714/738 |
| 7,657,812 B2 * | 2/2010 | Yamada | 714/738 |
| 7,725,793 B2 * | 5/2010 | Yamada et al. | 714/738 |
| 7,743,305 B2 * | 6/2010 | Yamada | 714/738 |
| 8,094,566 B2 * | 1/2012 | Hiraide | 370/241 |
| 8,258,802 B2 * | 9/2012 | Yaguchi et al. | 324/750.3 |
| 8,258,803 B2 * | 9/2012 | Hiraide et al. | 324/750.3 |
| 2005/0210170 A1 | 9/2005 | Otani | |
| 2008/0091377 A1 | 4/2008 | Kumaki | |
| 2008/0235498 A1 * | 9/2008 | Yamada | 712/227 |
| 2008/0235550 A1 * | 9/2008 | Yamada et al. | 714/738 |
| 2008/0250291 A1 * | 10/2008 | Yamada et al. | 714/738 |
| 2008/0258749 A1 * | 10/2008 | Yamada | 324/763 |
| 2011/0158103 A1 * | 6/2011 | Hiraide | 370/241 |
| 2011/0181310 A1 * | 7/2011 | Yaguchi et al. | 324/750.3 |
| 2011/0181311 A1 * | 7/2011 | Hiraide et al. | 324/750.3 |
| 2011/0184687 A1 * | 7/2011 | Morita et al. | 702/118 |

FOREIGN PATENT DOCUMENTS

| | | |
|---|---|---|
| JP | 2005-265630 A | 9/2005 |
| JP | 2007-047008 A | 2/2007 |
| WO | 2008/044421 A1 | 4/2008 |
| WO | 2009/144834 A1 | 12/2009 |

OTHER PUBLICATIONS

Japanese Office Action dated on Jan. 11, 2011, in a counterpart Japanese patent application JP2010-271601.

* cited by examiner

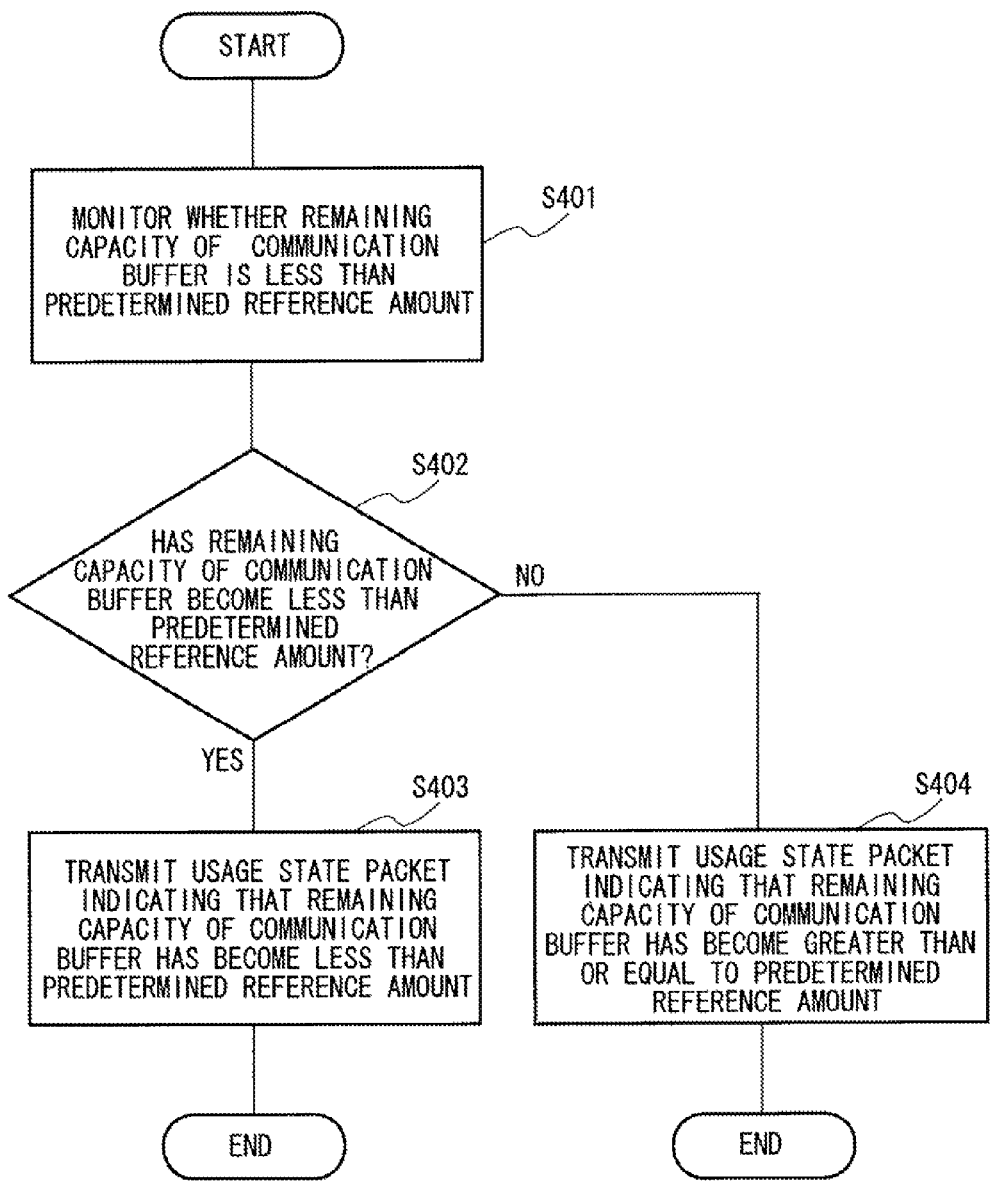

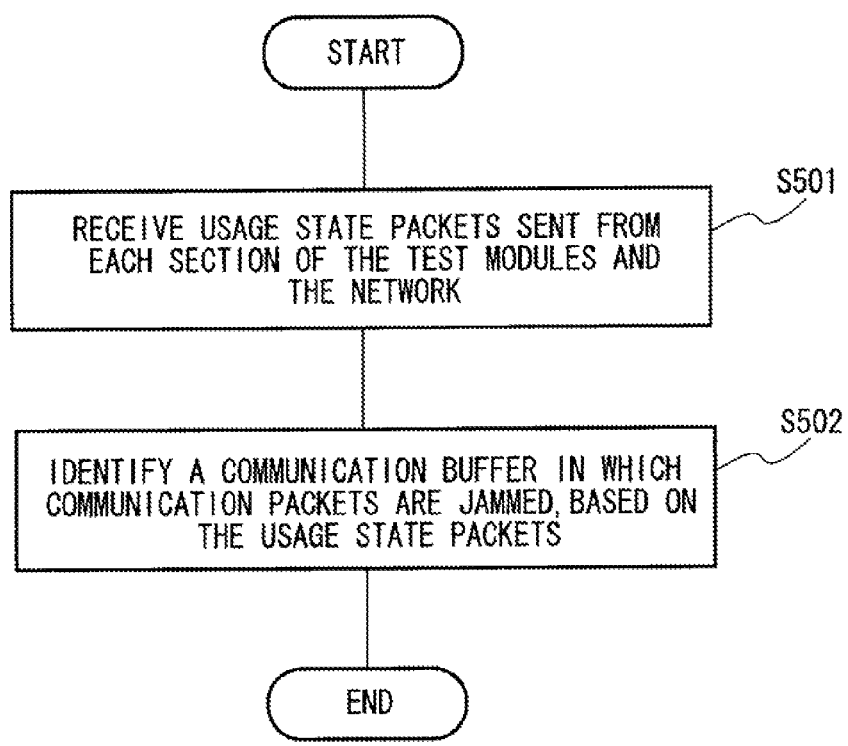

TEST APPARATUS AND TEST METHOD

BACKGROUND

1. Technical Field

The present invention relates to a test apparatus and a test method.

2. Related Art

A system is known that transmits access requests in packets from a transmitter to a receiver. For example, in a system for testing a device under test, access requests are transmitted in packets from a control apparatus to a test module.

In such a system, when packets are jammed in a portion of the transmission path, access requests cannot be transmitted from the control apparatus to the test module. In such a case, the entire system must be reset, and so repair takes a long time. Furthermore, the test module cannot be accessed from the control apparatus side, and so it is difficult to analyze the cause of the jam.

Patent Document 1: International Publication Pamphlet 2008/044421

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, comprising: a test module that tests the device under test by sending signals to and receiving signals from the device under test; a test controller that controls the test module; and a network that transmits communication packets between the test module and the test controller, wherein at least one of the test module and the network transmits to the test controller a usage state packet that indicates a usage state of a communication buffer that buffers the communication packets.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 4 shows an exemplary process performed by the test apparatus 10 for monitoring a communication buffer and transmitting, a usage state packet.

FIG. 5 shows an exemplary process performed by the test apparatus 10 for receiving usage state packets and identifying a communication buffer in which communication packets are jammed.

DESCRIPTION OF EXEMPLARY EMBODIMENTS

Hereinafter, an embodiment of the present invention will be described. The embodiment does not limit the invention according to the claims, and all the combinations of the features described in the embodiment are not necessarily essential to means provided by aspects of the invention.

Figure 1:
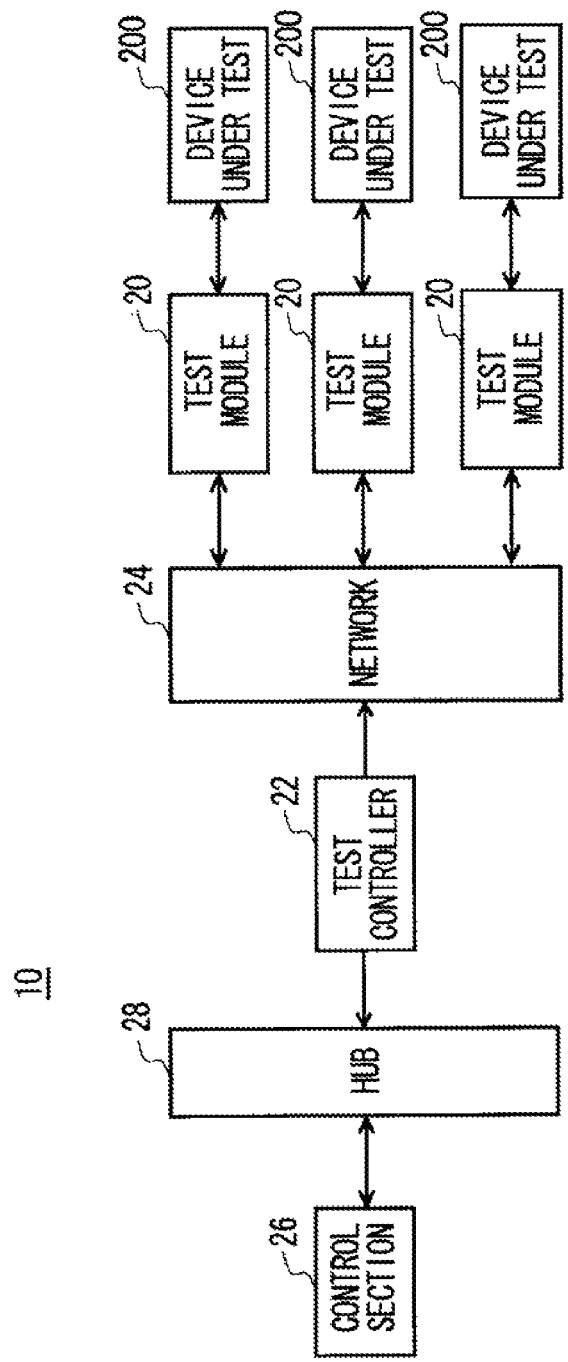
FIG. 1 shows a configuration of a test apparatus 10 according to an embodiment of the present invention.

FIG. 1 shows a configuration of a test apparatus 10 according to an embodiment of the present invention, along with devices under test 200. The test apparatus 10 tests at least one device under test 200. The test apparatus 10 includes at least one test module 20, a test controller 22, a network 24, a control section 26, and a hub 28.

The test module 20 tests the device under test 200 by transmitting and receiving signals to and from the device under test 200. For example, the test module 20 may supply the device under test 200 with a test signal having a waveform corresponding to a test pattern, and judge acceptability of the device under test 200 by comparing a response signal from the device under test 200 to a logic value corresponding to an expected value pattern.

Each test module 20 exchanges communication packets with the test controller 22 via the network 24. For example, each test module 20 may receive a communication packet including an access request from the test controller 22. Furthermore, each test module 20 may send to the test controller 22 a response to the access request and a communication packet that includes data, an interrupt request, or the like.

The test controller 22 controls each test module 20 by exchanging communication packets with the test modules 20 via the network 24. For example, the test controller 22 may send a communication packet including an access request to the test module 20 to be controlled. Furthermore, the test controller 22 may receive, from each test module 20, a response to the access request and a communication packet including data, an interrupt request, or the like. The test controller 22 may be realized by a computer.

The network 24 transmits communication packets between the test modules 20 and the test controller 22. In other words, the network 24 relays the communication packets between the test controller 22 and each test module 20. For example, the network 24 may transmit a communication packet received from the test controller 22 to a test module 20 that is indicated by identification information recorded in the header or the like of the communication packet. Furthermore, the network 24 may transmit a communication packet received from any one of the test modules 20 to the test controller 22.

The control section 26 performs overall control of the test apparatus 10. For example, the control section 26 may acquire a program for testing from an external computer, such as a work station, and a storage medium or the like, or may acquire a program that is input by a user. The control section 26 transmits the program and/or control instructions corresponding to the test to the test controller 22 via the hub 28.

The hub 28 connects the control section 26 to the test controller 22 in a manner to enable communication therebetween. For example, the hub 28 may provide this connection via an all-purpose or specialized high-speed serial bus.

Figure 2:
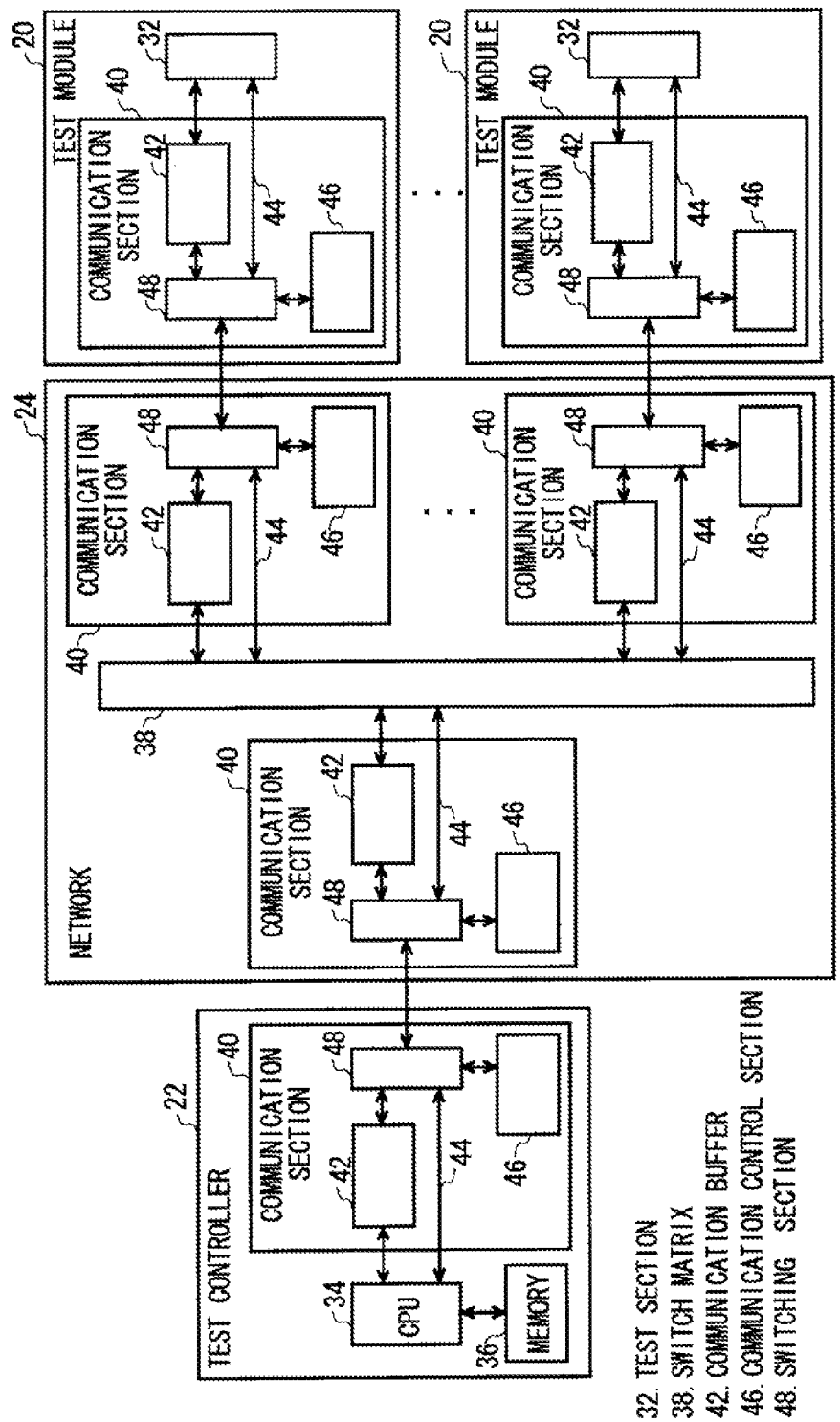
FIG. 2 shows an exemplary configuration of test modules 20, the test controller 22, and the network 24 according to the present embodiment.

FIG. 2 shows an exemplary configuration of test modules 20, the test controller 22, and the network 24 according to the present embodiment. Each test module 20 may include a test section 32 and a communication section 40. The test section 32 tests the device under test 200 connected to the test module 20. The communication section 40 in each test module 20 exchanges communication packets with the network 24.

The test controller 22 includes a CPU 34, a memory 36, and a communication section 40. The CPU 34 executes a program to control each test module 20. The memory 36 is a non-volatile memory whose contents are not lost when the power supply is turned off, and the CPU 34 writes data to and reads data from the memory 36. The communication section 40 in the test controller 22 exchanges communication packets with the network 24.

The network 24 includes a switch matrix 38 and a plurality of communication sections 40. The switch matrix 38 has a plurality of ports, and a communication packet that is input to one of these ports is output from a port identified by identification information that is recorded in the header or the like of the communication packet. Each communication section 40 in the network 24 is connected to a corresponding port of the switch matrix 38. Each communication section 40 in the network 24 exchanges communication packets with the test controller 22 or with one of the test modules 20.

This network 24 can transmit a communication packet input from the test controller 22 to a test module 20 indicated by the identification information recorded in the communication packet. Furthermore, the network 24 can transmit a communication packet input from a test module 20 to the test controller 22.

Here, the communication sections 40 in the test modules 20, the test controller 22, and the network 24 each include a communication buffer 42, a bypass line 44, a communication control section 46, and a switching section 48. When testing a device under test 200, the communication buffer 42 buffers ordinary communication packets that are exchanged between the test controller 22 and the test module 20.

Each communication buffer 42 may be a FIFO (first in first out) buffer. In other words, each communication buffer 42 stores communication packets received from upstream, and outputs the stored communication packets downstream in the order in which the communication packets are received. Such communication buffers 42 can enable the test modules 20, the test controller 22, and the network 24 to operate safely by accounting for the difference between (i) data transmission speed between upstream circuits and the communication buffer 42 and (ii) data transmission speed between downstream circuits and the communication buffer 42.

Each bypass line 44 transmits downstream a communication packet received from upstream, while bypassing the communication buffer 42. The bypass line 44 transmits the communication packets without buffering the communication packets in the communication buffer 42, and instead buffers the communication packets in a buffer having fewer entries than the communication buffer 42.

Each communication control section 46 monitors the usage state of the corresponding communication buffer 42. The communication control section 46 transmits to the test controller 22 a usage state packet indicating the usage state of the communication buffer 42 buffering the communication packets. For example, the communication control section 46 may monitor the remaining capacity of the communication buffer 42 and send a usage state packet to the test controller 22 when the remaining capacity drops below a predetermined amount.

Each switching section 48 switches whether a communication buffer received from upstream (i) is transmitted downstream after being buffered in the communication buffer 42 or (ii) bypasses the communication buffer 42 to be transmitted downstream via the bypass line 44. For example, when an ordinary communication packet is exchanged between the test controller 22 and the test module 20 during testing of the device under test 200, the switching section 48 may transmit the received communication packet downstream after buffering this packet in the communication buffer 42.

When an error occurs and an unordinary communication packet is received, the switching section 48 may transmit the unordinary communication packet downstream via the bypass line 44 while bypassing the communication buffer 42. For example, when a usage state packet is received, the switching section 48 may transmit the usage state packet downstream while bypassing the communication buffer 42. Furthermore, when an emergency packet, which is sent from the test controller 22 in response to an error occurring in one of the circuits, is received, the switching section 48 transmits the emergency packet downstream while bypassing the communication buffer 42.

Figure 3:
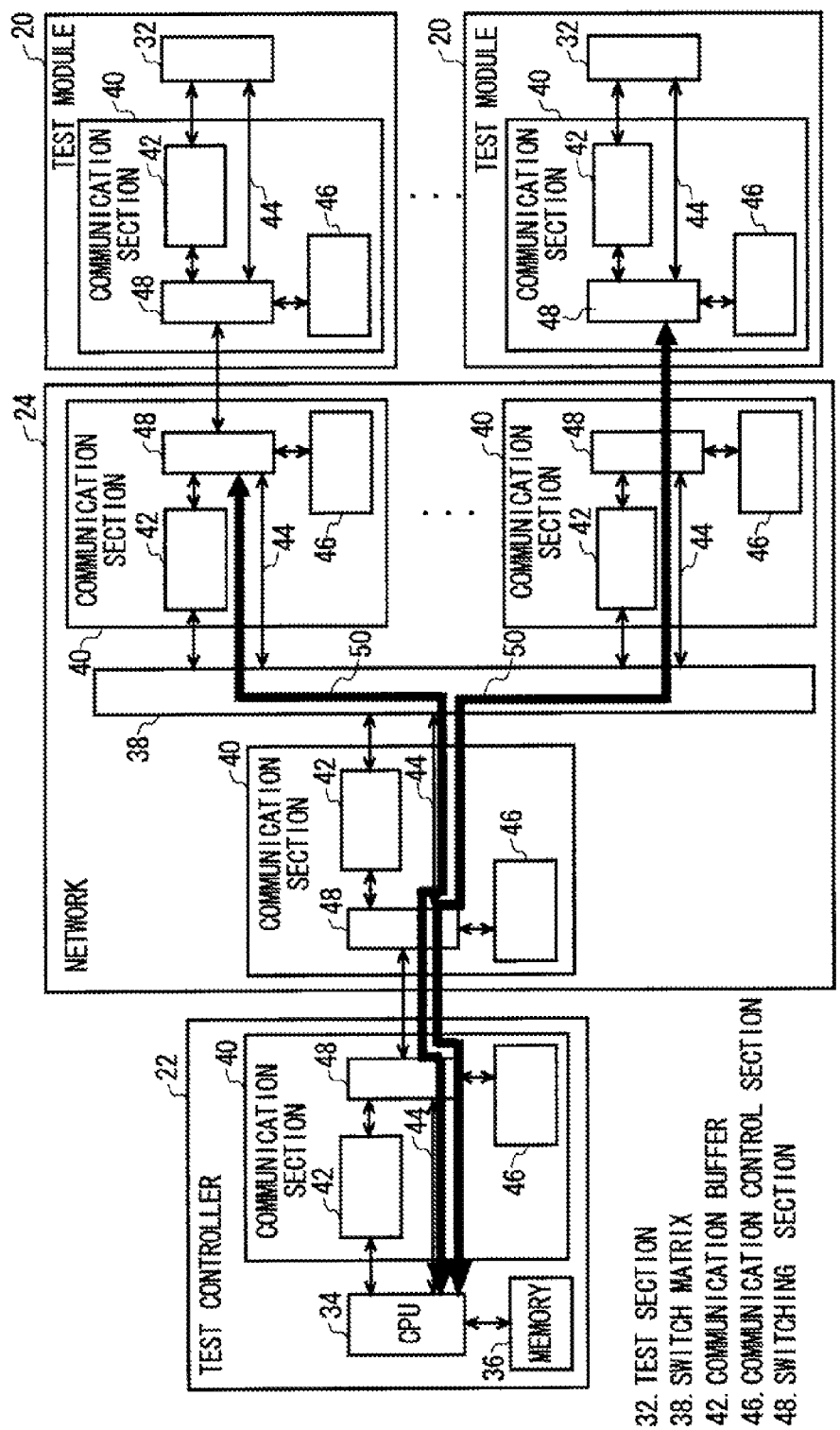
FIG. 3 shows an exemplary path of usage state packets transmitted from the test module 20 and the network 24 to the test controller 22 in the test apparatus 10 according to the present embodiment.

FIG. 3 shows exemplary paths 50 of usage state packets transmitted from the test module 20 and the network 24 to the test controller 22 in the test apparatus 10 and emergency packets transmitted from the test controller 22 to the test module 20 and the network 24 according to the present embodiment. Here, it is assumed that an error occurs in one of the circuits in the network 24 and in the test module 20. In this case, communication packet processing by the circuit in which the error occurs cannot proceed, and so communication packets are jammed in the communication buffer 42 upstream from the circuit in which the error occurs.

When the jammed communication packets have built up for a long time, the remaining capacity of the communication buffer 42 upstream from the defective circuit decreases, causing an overload. To solve this problem, the communication section 40 in at least one of a test module 20 and the network 24 performs the process described below.

As shown in FIG. 4, during testing, the communication control section 46 in the communication section 40 monitors whether the remaining capacity of the communication buffer 42 in the communication section 40 is less than a predetermined reference amount (S401). When the remaining capacity of the communication buffer 42 becomes less than the predetermined reference amount (S402), the communication control section 46 transmits to the test controller 22 a usage state packet indicating that the remaining capacity of the communication buffer 42 has become less than the predetermined reference amount (S403). In this way, the test module 20 and the network 24 can notify the test controller 22 that, for example, an error has occurred in a downstream circuit and communication packets are building up in the communication buffer 42.

When the remaining capacity of the communication buffer 42 returns to greater than or equal to the predetermined reference amount after falling below the predetermined reference amount the communication control section 46 in the communication section 40 may transmit to the test controller 22 a usage state packet indicating that the remaining capacity of the communication buffer 42 has become greater than or equal to the predetermined reference value (S404). In this way, the test module 20 and the network 24 can notify the test controller 22 that, for example, the error occurring in the downstream circuit has been fixed and the communication packets are no longer jammed in the communication buffer 42.

The communication control section 46 in the communication section 40 may insert identification information into the usage state packet for identifying the communication section 40. In this way, the test module 20 and the network 24 can notify the test controller 22 that communication packets are jammed or have been fixed in a communication buffer 42 in one of the communication sections 40.

When a usage state packet is received from upstream, the switching section 48 in the communication section 40 transmits the usage state packet while bypassing the communication buffer 42. In other words, when a usage state packet is received, the switching section 48 in the communication section 40 transmits the usage state packet downstream via the bypass line 44. In this way, the test module 20 and the network 24 can reliably transmit the usage state packet to the test controller 22 in a short time, without jamming in the communication buffer 42.

As shown in FIG. 5, the test controller 22 receives usage state packets sent from each section of the test modules 20 and the network 24 (S501), and performs the following process. When a usage state packet indicating that communication packets are jammed in the communication buffer 42 is received, the CPU 34 of the test controller 22 identifies the communication buffer 42 in which the communication packets are jammed, based on the usage state packet (S502). For example, the CPU 34 identifies the communication buffer 42 in which the communication packets are jammed based on the identification information recorded in the header or the like of the received usage state packet. In this way, the test controller 22 can identify the position of the circuit that caused the communication packet jam.

In response to receiving a usage state packet indicating that communication packets are jammed in a communication buffer 42, the CPU 34 of the test controller 22 sends an emergency packet to a circuit located downstream from the communication buffer 42, while bypassing the communication buffer 42, to perform at least one of defect detection or defect repair on the circuit.

For example, the CPU 34 may transmit, to a circuit located downstream from the communication section 40 that sent the usage state packet indicating the jam in the communication buffer 42, an emergency packet that includes an access request for responding to the test controller 22 concerning the content of the defect. The circuit that receives this emergency packet transmits an emergency packet including a response indicating the content of the defect to the test controller 22. In this way, the test controller 22 can identify the cause of the communication packet jam in the communication buffer 42.

Furthermore, the CPU 34 may transmit, to a circuit located downstream from the communication section 40 that sent the usage state packet indicating the jam in the communication buffer 42, an emergency packet that includes a reset request for repairing the defect. The circuit that receives this emergency packet performs a local reset of the circuit. In this way, the test controller 22 can locally reset and repair a circuit that causes a communication packet jam in the communication buffer 42.

The switching section 48 of the communication section 40 in each test module 20 and in the network 24, upon receiving am emergency packet, transmits the emergency packet downstream while bypassing the communication buffer 42. In this way, the network 24 and each test module 20 can quickly and reliably transmit emergency packets between the test controller 22 and a circuit in which an error occurs.

When a usage state packet indicating a jam in a communication buffer 42 is received, the CPU 34 of the test controller 22 sequentially stores the received usage state packets in the memory 36, the contents of which are not lost when the power supply of the test apparatus 10 is turned off. In this way, even when the power supply must be turned off to deal with an error in one of the circuits, the test controller 22 can identify the circuit or the like that caused the error by reading the usage state packets stored in the memory 36.

When communication packets are jammed in a portion of a path transmitting communication packets, the test apparatus 10 of the present embodiment described above can notify the test controller 22 concerning the cause and location of the jam. Furthermore, the test apparatus 10 can locally repair the defect in the circuit that causes the jam. In other words, the test apparatus 10 can perform the repair without resetting the entire system, thereby decreasing the repair time.

While the embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
    a test module that tests the device under test by sending signals to and receiving signals from the device under test;
    a test controller that controls the test module; and
    a network that transmits communication packets between the test module and the test controller, wherein
    at least one of the test module and the network transmits to the test controller a usage state packet that indicates a usage state of a communication buffer that buffers the communication packets.

2. The test apparatus according to claim 1, wherein
    at least one of the test module and the network transmits to the test controller the usage state packet indicating that a remaining capacity of the communication buffer has become less than a predetermined reference capacity.

3. The test apparatus according to claim 1, wherein
    at least one of the test module and the network transmits to the test controller the usage state packet indicating that a remaining capacity of the communication buffer has become greater than or equal to a predetermined reference capacity.

4. The test apparatus according to claim 1, wherein
    the test module and the network transmit the usage state packet in a manner to bypass the communication buffer that buffers an ordinary communication packet that is transmitted between the test controller and the test module when testing the device under test.

5. The test apparatus according to claim 4, wherein
    in response to receiving the usage state packet indicating that the communication packets are jammed in the communication buffer in at least one of the test module and the network, the test controller transmits an emergency packet that bypasses the communication buffer to a circuit located downstream from the communication buffer to perform at least one of defect detection and defect repair of the circuit.

6. The test apparatus according to claim 1, wherein the test controller sequentially stores the received usage state packets in a memory.

7. The test apparatus according to claim 6, wherein the test controller stores the received usage state packets in a memory whose stored content is not lost when the power supply of the test apparatus is turned off.

8. The test apparatus according to claim 1, wherein the test controller identifies a communication buffer in which communication packets are jammed, based on usage state packets sent from each section of the test module and the network.

9. A test method of a test apparatus testing a device under test, wherein the test apparatus includes:

a test module that tests the device under test by sending signals to and receiving signals from the device under test;

a test controller that controls the test module; and a network that transmits communication packets between the test module and the test controller, and the test method comprises at least one of the test module and the network transmitting to the test controller a usage state packet that indicates a usage state of a communication buffer that buffers the communication packets.

* * * * *